United States Patent [19]
Amato et al.

[11] Patent Number: 5,446,300
[45] Date of Patent: Aug. 29, 1995

[54] SEMICONDUCTOR DEVICE CONFIGURATION WITH MULTIPLE HV-LDMOS TRANSISTORS AND A FLOATING WELL CIRCUIT

[75] Inventors: Michael Amato, Shrub Oak; Satyendranath Mukherjee, Yorktown Heights, both of N.Y.; Paul R. Veldman, Oss, Netherlands; Armin F. Wegener, Grossenlüder, Germany

[73] Assignee: North American Philips Corporation, New York, N.Y.

[21] Appl. No.: 971,382

[22] Filed: Nov. 4, 1992

[51] Int. Cl.$^6$ .............. H01L 27/088; H01L 29/78
[52] U.S. Cl. ................... 257/343; 257/490; 257/500; 257/776
[58] Field of Search ............... 257/335, 379, 358, 338, 257/336, 337, 369, 371, 343, 490, 492, 500, 776

[56] References Cited

U.S. PATENT DOCUMENTS

| | | | |
|---|---|---|---|
| 3,379,941 | 4/1968 | Blanluet | 317/235 |
| 4,661,838 | 4/1987 | Wildi et al. | 257/492 |
| 4,678,936 | 7/1987 | Holloway | 307/303 |
| 4,878,096 | 10/1989 | Shirai et al. | 257/338 |
| 5,003,362 | 3/1991 | Lee et al. | 257/409 |
| 5,045,900 | 9/1991 | Tamagawa | 257/328 |
| 5,146,298 | 9/1992 | Eklund | 257/328 |
| 5,192,989 | 3/1993 | Matsushita et al. | 257/342 |

FOREIGN PATENT DOCUMENTS

| | | |
|---|---|---|
| 0234269 | 1/1986 | European Pat. Off. . |
| 0239060 | 3/1986 | European Pat. Off. . |
| 58-135666 | 8/1983 | Japan . |

Primary Examiner—Robert P. Limanek
Assistant Examiner—David B. Hardy
Attorney, Agent, or Firm—Steven R. Biren

[57] ABSTRACT

A semiconductor device is provided having a substrate which includes a floating circuit well with turn on/turn off signals generated by a voltage drop proximate to at least one resistor contained therein, and having high-voltage interconnects to connect the drain terminals of a plurality of LDMOS transistors to the resistor in the floating well and wherein the transistors, resistor and floating well are combined into an integrated structure which eliminates the high voltage interconnect crossovers.

29 Claims, 8 Drawing Sheets

SEMICONDUCTOR DEVICE CONFIGURATION WITH MULTIPLE HV-LDMOS TRANSISTORS AND A FLOATING WELL CIRCUIT

BACKGROUND OF THE INVENTION

This invention relates to a novel semiconductor device comprising a semiconductor body configuration which combines a plurality of HV-LDMOS transistors, a plurality of resistors, and a floating circuit well into a single structure.

The need is currently increasingly felt to integrate on a single silicon chip signal processing means and high-voltage components which operate efficiently and reliably.

In conventional LDMOS integrated circuits having floating wells, high-voltage interconnects are necessary to connect parts of the LDMOS transistors to circuit components within the floating well. In such structures, a level shift signal to the floating well is usually generated by a separate circuit and is brought to the floating well via current supplied via a cross-over. These high-voltage cross-overs create performance and fabrication problems.

A typical circuit for a floating well and level shifter from ground potential to that of the floating well is illustrated in FIGS. 1 to 4 which show circuit diagrams and a cross-section through a silicon wafer accommodating at least two insulated LDMOS level shift transistors and a floating well with circuitry. Such a device is constructed by means well known in the art and includes a substrate 7 of a first conductivity type, preferably with p polarity, a buried layer 8 with opposite conductivity, preferably with n+ polarity connected to an epitaxial layer 6, preferably of n− polarity. Above the buried layer 8, the epitaxial layer 6 is arranged. On the epitaxial layer 6, an oxide layer 9 is used on which a masking photoresist has been utilized to form a P-well portion 10 and an N-well portion 11 of the floating well. Subsequently, by appropriate masking, photolithography, and by ion implantation by means well known in the art, various p+ regions 12, 13, 14, 15, 16, and 17 and n+ regions 18, 19, 20, 21, 22, 23, 24, and 25 are formed with suitable metallization 26, 27, 28, 29, 30, 31, 32 and 33 to form the final structure shown in FIG. 4. Within the n-epitaxial layer, the regions 40 and 41 forming the body, 26 and 28 forming the source, and 27 forming the drain of the LDMOS transistor 3, and the regions 42 and 43 forming the body, 31 and 33 forming the source, and 32 forming the drain of the LDMOS transistor 5, as well as the p+ regions (p-iso regions) 12, 13, 14 and 15 separating the n-epitaxial layer 6 into isolated n-epitaxial regions 45, 46 and 47, are provided. The reference numerals 34 and 37 represent the gate electrodes.

In FIG. 3, the p+ regions 13 and 14 isolate the LDMOS devices 3 and 5, respectively, from the floating-well circuitry. The N-MOS device formed inside P-well 10, and the P-MOS device formed inside N-well 11 form part of the circuitry inside floating well 1.

Thus, as will be seen from FIGS. 3 and 4, the high voltage cross-overs make contact to circuitry in the floating well represented by PMOS 29, NMOS 30, n-well 11, and p-well 10, for example the high voltage interconnect 2, 4 is made from the drain contact 27, 32 of the LDMOS transistor 3, 5 to the N-well portion 11 and the P-well portion 10 of the floating well, crossing over the LDMOS transistor 3, 5 and junction 35, 36.

In such structures, the circuit in the well floats from 0 volts up to 1000 V. Turn on/turn off signals are generated by a voltage drop at the resistors $R_1$ and $R_2$ whereby $V_{R1}$, $V_{R2}$ is 0–20 volts. The high voltage interconnects are necessary to connect the drain terminals of the LDMOS transistors to the resistors $R_1$ and $R_2$ in the floating well. In such structures, a low voltage signal is provided to a level shifter which transfers it to a higher level. In a typical application, e.g. as a power converter, a voltage signal must be referenced to the output of an inverter stage. As this output voltages goes up and down, the signal applied floats with it. Because both the n-epitaxial layer and the p-substrate can support high voltage, the n-epitaxial regions can be tied to a node having essentially a positive DC voltage with respect to the output of, for example, a half-bridge circuit, and supply a signal between the control-and reference-electrode of an NPN or N-channel FET (MOS-FET, IGBT) device having its reference electrode essentially connected to the output of said half-bridge circuit, via a high-voltage crossover and the circuitry in the floating well. The term "reference electrode essentially connected to the output" is meant to cover a ripple on the DC voltage and an indirect connection of the reference electrode to the output of the half-bridge, e.g. via a current sense resistor or transistor, including cascoded switching (emitter, source or cathode switching). The term "control electrode" is meant to indicate a base and gate; and "reference electrode" indicates an emitter, source or cathode (N-channel).

FIGS. 1 and 2 show circuit diagrams which illustrate the input/output electronics of the floating well.

In FIG. 1, a bootstrap-capacitor 50 maintains a voltage between node 59 and 60 of typically between 5 and 20 Vdc; node 60 being positive with respect to node 59.

Assume the output voltage of comparator 53 to be low with respect to node 59, i.e. the voltage at the output of comparator 53 is at essentially the same voltage as node 59. By means of the non-inverting buffer formed by transistors 54, 55, 56 and 57, output node 58 will be pulled down to essentially the same voltage as node 59.

The state of the voltage at node 58 with respect to node 59 can be changed in the following way: By applying a pulse of voltage of well controlled magnitude to the control electrode of level-shift transistor 3, this device will sink a pulse of current into its drain 27. This will result in a pulse-shaped voltage drop across resistor 51, relatively independent of the momentary voltage level of node 59 and 60. As there is no current flow through the other level-shift transistor 5 at that time, the voltage across resistor 52 will be essentially 0. As soon as the difference between the voltage across resistors 51 and 52 exceeds the hysteresis-level built into comparator 53, the output of comparator 53 will go high with respect to node 59. The non-inverting buffer formed by the transistors 54, 55, 56 and 57 will consequently pull output node 58 up to essentially the same voltage as node 60, thereby making node 58 positive with respect to node 59.

After the voltage pulse at the control electrode of transistor 3 is over, the difference in voltage across resistors 51 and 52 returns to 0. Due to the hysteresis built into comparator 53, said comparator will retain the state of its output.

Conversely, if it is desired to change the state of node 58 and to return the voltage at node 58 to essentially the same voltage as node 59, a pulse of voltage of well controlled magnitude can be applied to the control electrode of transistor 5. This will result in a pulse-shaped flow of current into drain 32 of transistor 5, and consequently result in a voltage drop across resistor 52. As there is no flow of current into drain 27 of transistor 3, the voltage drop across resistor 51 will be 0. As soon as the difference between the voltages across resistors 51 and 52 exceeds the hysteresis-level built into comparator 53, the output of comparator 53 will go low with respect to node 59. The non-inverting buffer formed by the transistors 54, 55, 56 and 57 will consequently pull output node 58 down to essentially the same voltage as node 59.

After the voltage pulse at the control electrode of transistor 5 is over, the difference in voltage across resistors 51 and 52 returns to 0. Due to the hysteresis built into comparator 53, said comparator will retain the state of its output.

The circuit illustrated in FIG. 2 acts in an identical fashion, with the pulsating current sources formed by transistors 3 and 5 being replaced by the cascoded current sources formed by transistor 63 and 64, or 65 and 66, respectively.

Transistor 64 and 66 act as current sources, and can be standard N-MOS low-voltage devices or can even be replaced by low-voltage NPN bipolar devices. Transistors 63 and 65 are LDMOS devices, and are used to support the high voltage. FIG. 2 shows two embodiments of these LDMOS devices; one with the body connected to the source (transistor 63) and one with the body connected to ground (transistor 65).

As will be appreciated, problems arise when attempts are made to place such conventional structures on a single silicon chip. Properties of the drift region make it very difficult to put a line across this region to connect the high-voltage area of the floating well to the transistor. Additionally, the high voltage interconnects adversely affect the high voltage junction, require at least two additional mask steps increasing fabrication costs, and necessitate a larger chip size.

SUMMARY OF THE INVENTION

An object of the present invention is to provide a circuit for a floating well and level shifter from ground potential to the floating well wherein high-voltage interconnect cross-overs and the problems associated therewith are substantially eliminated.

Another object of the invention is to provide a device wherein there is a reduction of capacitances and chip size.

These and other objects are accomplished by the present invention in which in a semiconductor device, preferably a semiconductor or integrated circuit comprising a semiconductor body defined by a plurality of superimposed layers with opposite conductivity types and at least one insulating oxide layer, at least one and prefereably at least two high voltage LDMOS transistors, at least one and preferably at least two sense resistors, and a floating circuit well are combined into an integrated circuit on a single silicon chip in which the high-voltage cross-overs are substantially eliminated, and in which a low-voltage level shift signal to the floating well is provided through the high voltage region of the floating well itself (instead of through the high-voltage region of a separate circuit which signal is brought to the resistors in the floating well via a cross-over).

According to the invention, a device is provided wherein the level shift current sources are incorporated in the same N-well as the floating well circuitry, i.e. a built-in resistor is present in the n-epi layer. This built-in resistor with "parasitic" resistance is used to convert the level shift signal current to a voltage signal that is sensed by circuitry in the floating well. Thus the device of the invention lets current flow to the low voltage area through the gate-channel down to the ground and uses that current to generate a signal, i.e. the current flows from an n+ region through a n-epi resistor to a sense node.

The structures of the invention are eminently suitable for eliminating problems associated with high-voltage interconnect crossovers discussed above and provides enhanced integrated circuit devices as further described and claimed hereinbelow.

The invention further comprises improved and enhanced structures of the type just described but wherein the connection between the drain of the current sources and the floating well is spaced by a predetermined distance L1 and/or is spaced by a predetermined distance L1 over an area of reduced cross-section with a width W1, preferably a necked-in area, whereby the parasitic resistance between the current sources and the floating well is increased considerably.

Such enhanced structures may embody circular LDMOS current sources of minimum dimensions thereby allowing the current sources to be located anywhere along the floating well including locations adjacent to or opposite the floating well. Additionally, a sense resistor inside the floating well may be used which is voltage independent and by which the parasitic resistance is maximized. Moreover, the parasitic resistor may be increased to a very high value and when so valued, the voltage independent sense resistor inside the floating well is used.

DETAILED DESCRIPTION OF PREFERRED EMBODIMENTS

Figure 1:
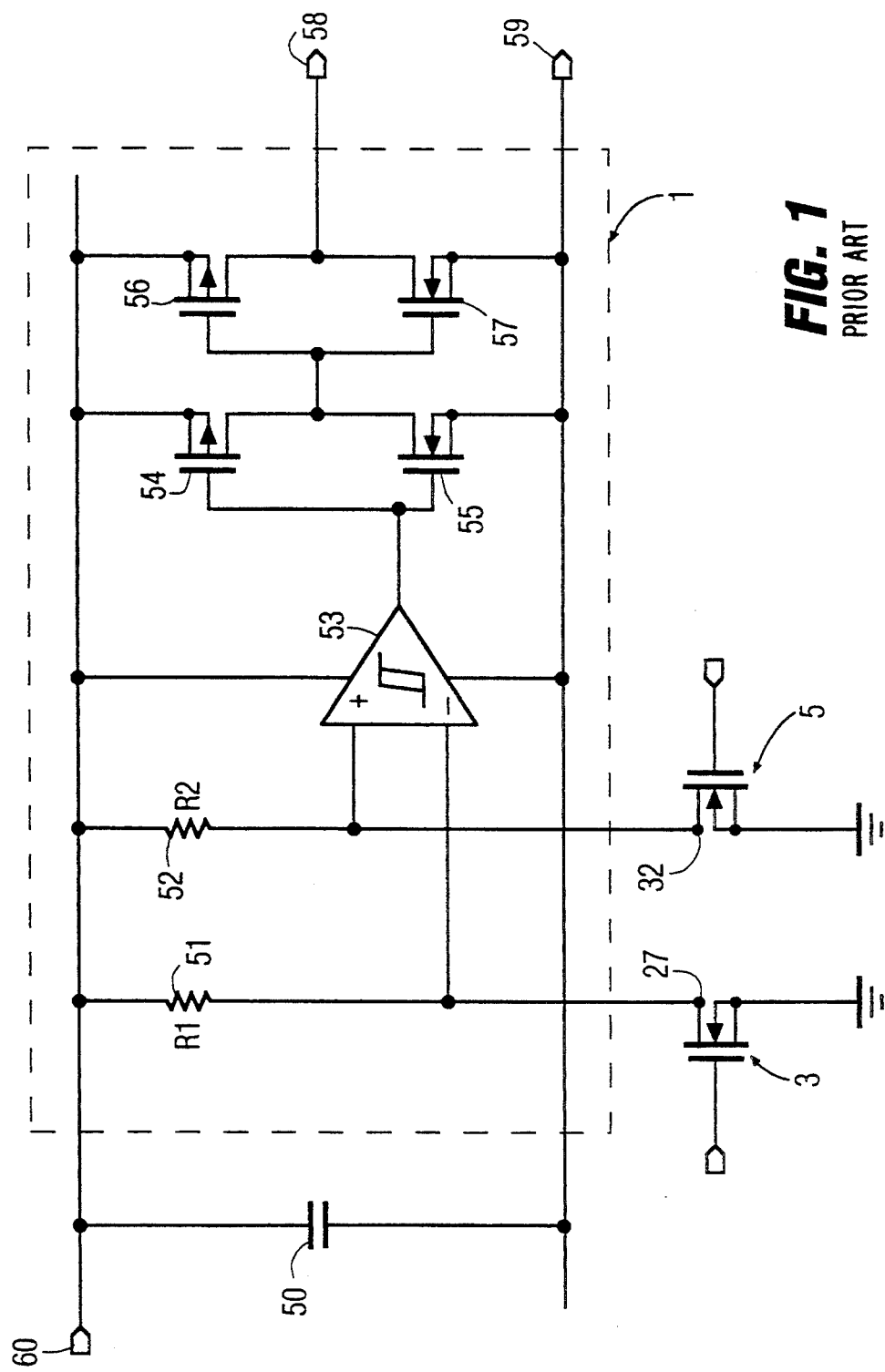
FIG. 1 is a circuit diagram for a conventional circuit for a floating well and level shifter from ground potential to the following well.
Figure 2:
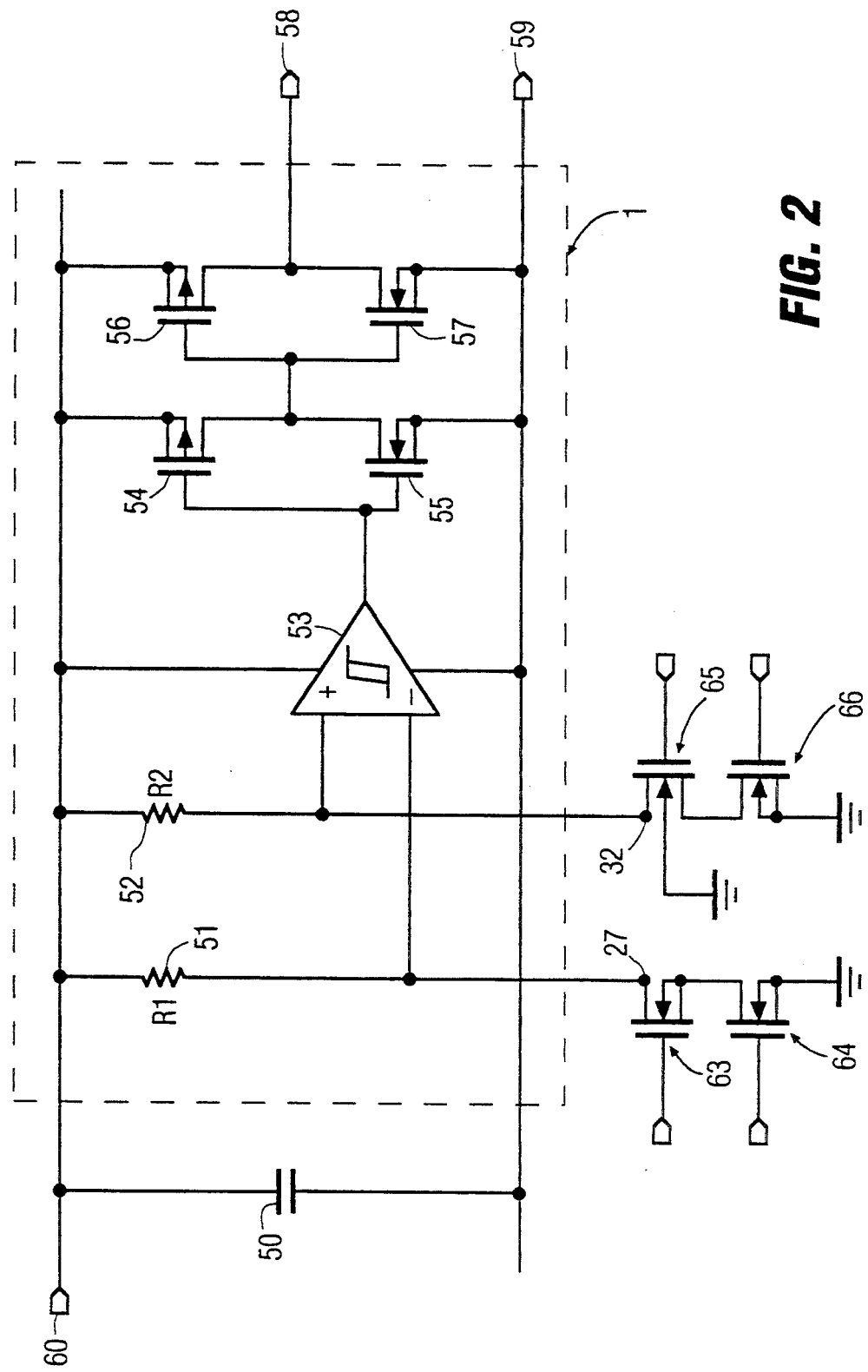
FIG. 2 is an alternative circuit diagram for a floating well and level shifter similar to that of FIG. 1.
Figure 3:
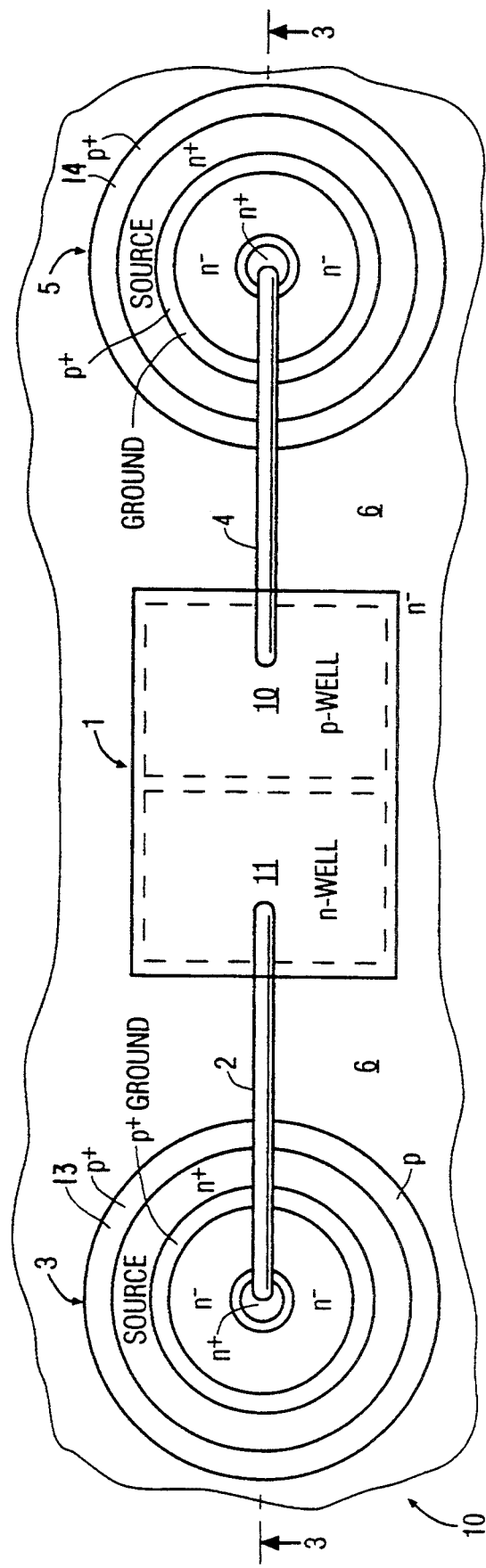
FIG. 3 is a top view of a device embodying the circuit of FIG. 1.
Figure 4:
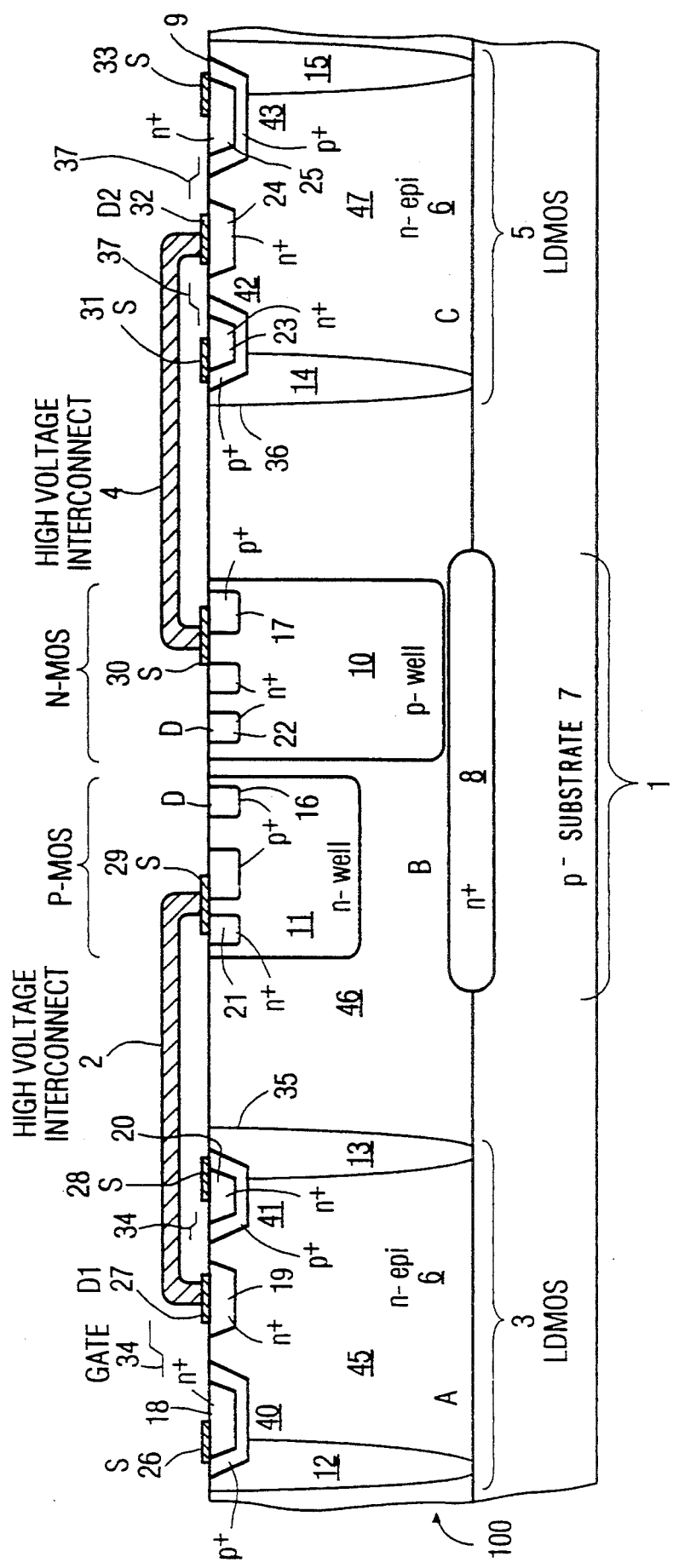
FIG. 4 is a or cross-sectional view through the substrate of the device taken along line 3—3 of FIG. 3.

With reference to FIGS. 5–11, parts similar to parts described above are referred to by like reference numerals incremented by 100 except that the p+ regions 13, 14 the regions 20, 28, 41 and 23, 31, 42 and the corresponding sections of the gates have been eliminated. In accordance with the present invention, the structure comprises two LDMOS level shift transistors 103, 105 comprising an epitaxial layer 106 of low electrical activity, (e.g., a N-conductivity type drift layer) grown on a p-substrate 107 substantially as described above with respect to FIGS. 1 to 4. However, in the invention structure, the drain contacts 127, 132 of the level shift current sources formed by the LDMOS devices 103, 105 are spaced apart from the floating well 101 by a distance Ld, and the high-voltage interconnect has been eliminated. The level shift current sources are placed in the same n-epitaxial region as the floating well circuitry, wherein the parasitic resistance $R_1$, $R_2$ between the drain n-region 119, 124 of the current sources and the n-regions 108, 182 and 183 is created and functionally utilized.

Figure 5:
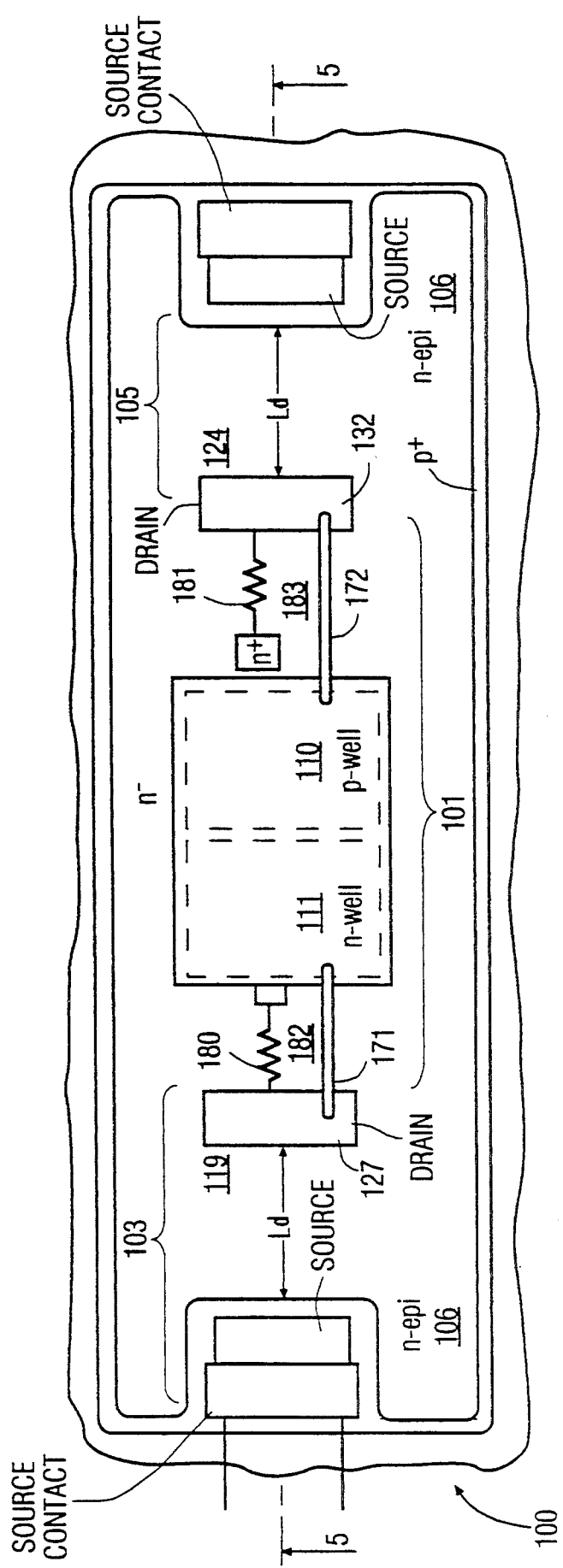
FIG. 5 is a top view of a device embodying a circuit of this invention for a floating well and level shifter from ground potential to the floating well.
Figure 6:
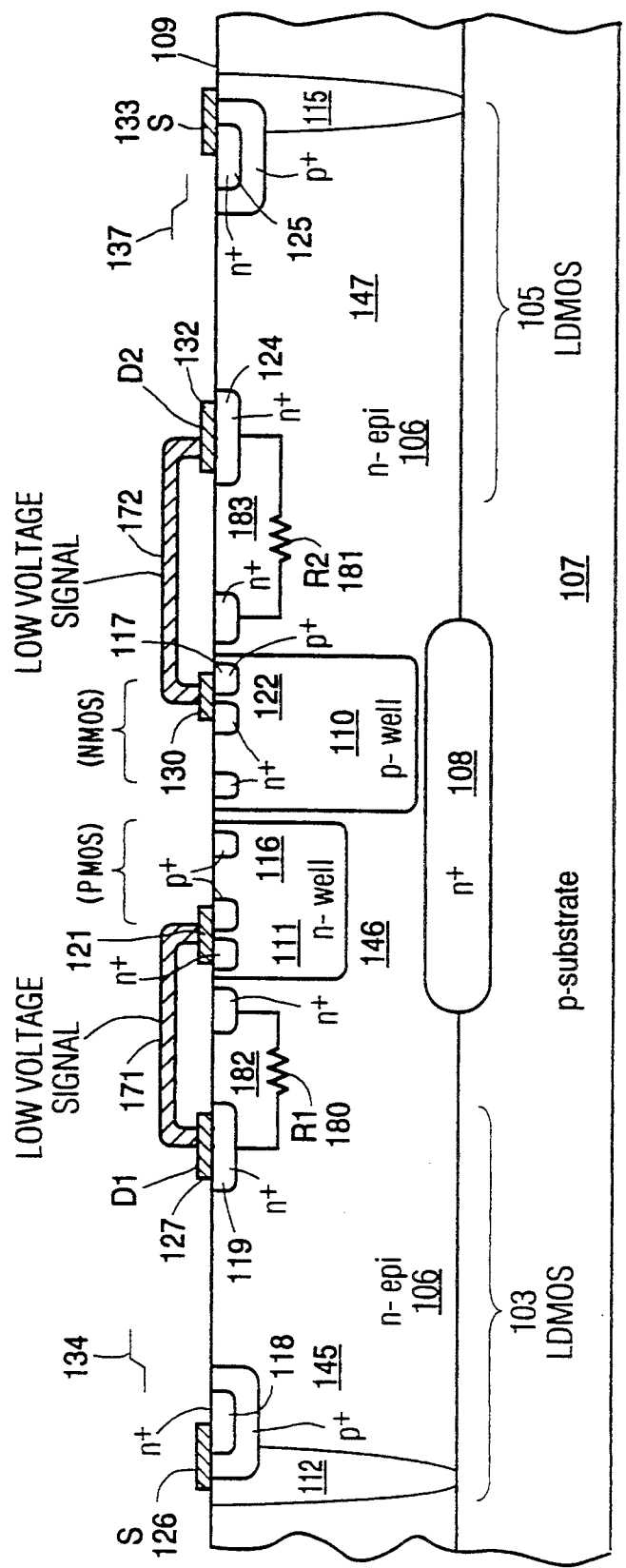
FIG. 6 is a cross-sectional view through the substrate of the circuit taken along line 5—5 of FIG. 5.

In FIGS. 5 and 6, the metal regions 127 and 132 form the drain contacts of LDMOS 103 and 105 respectively. At the same time, the n+ regions 119 and 124 form one of the terminals of the resistors R1 and R2 (180 and 181), where the n+ portions of the regions 182 and 183, together with n-buried layer 108 form the other terminal of the resistors R1 and R2 (180 and 181); these latter terminals are electrically equivalent to circuit-node 60 in FIG. 1. The resistance of R1 and R2 (180 and 181) is formed by the part of the n-epitaxial layer 106 between region 119 and 108, 182 or between region 124 and 108, 183 respectively.

More specifically, with reference to FIGS. 5 to 11, a high-voltage structure is illustrated which comprises a circuit 100 which comprises a floating well 101 connected to LDMOS level shift transistors 103 and 105 via integrated $R_1$ and $R_2$ sense resistors 180 and 181 and in which high-voltage interconnects are eliminated although low voltage cross-overs 171 and 172 between the floating well and transistors for sensing purposes are retained. Since these are not of high voltage, the problems discussed above relative to high voltage cross-overs are eliminated. In this structure, all interconnects run above the silicon in a low voltage metal connection with less than 20 V necessitating low voltage junctions. Since high-voltage interconnects are not present, simultaneously smaller capacitances are achieved resulting in lower $CV^2$ losses and a reduction in the chip size. In such a structure, external resistors previously employed have been eliminated and parasitic resistors, i.e. built in resistors in the n-epitaxial layer are employed to convert the level shift current to a voltage signal that is sensed by the circuit in the floating well.

Figure 7:
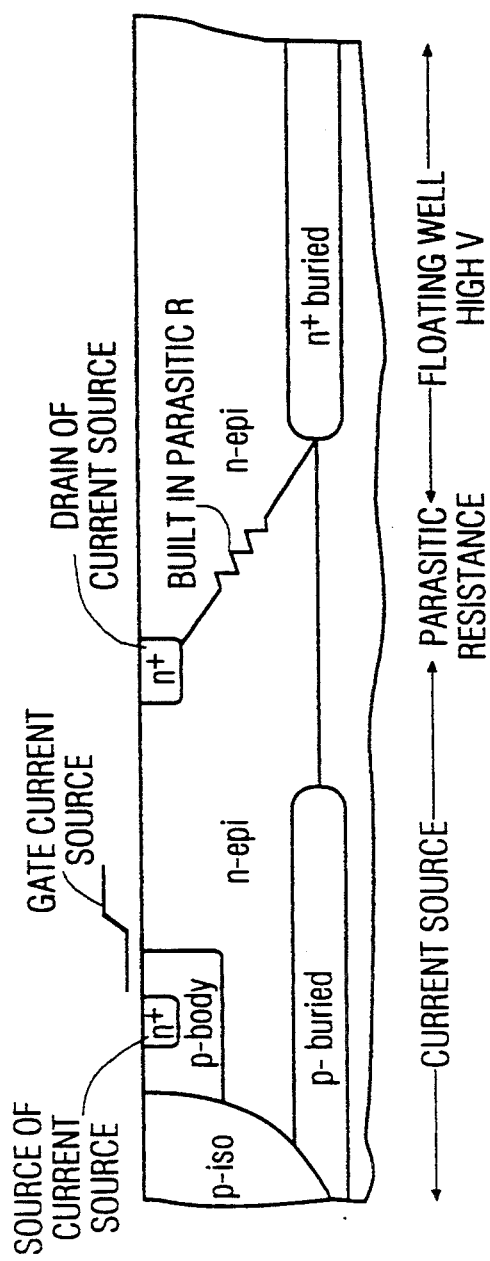
FIG. 7 shows a portion of an integrated circuit taken along line 5—5 of FIG. 5 showing the built in resistor.
Figure 8:
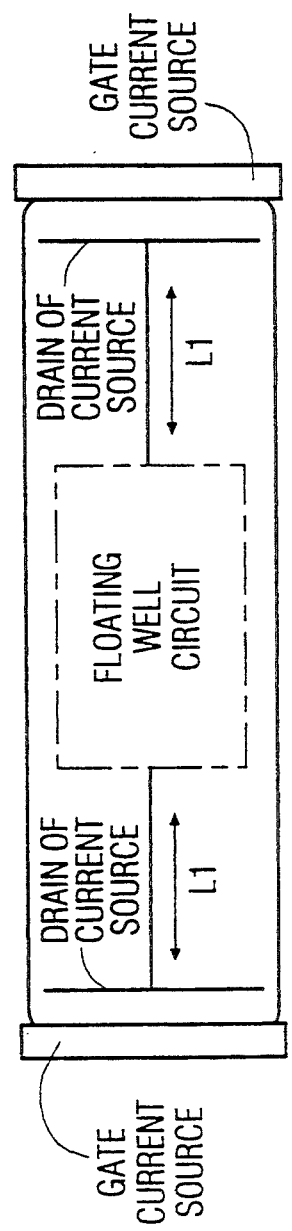
FIG. 8 is a top view similar to that of FIG. 7 showing a portion of the floating well and level shifters.

In one embodiment of the invention, the need for high-voltage interconnect is circumvented by putting the level shift current sources in the same n-epitaxial portion as the floating well circuitry and using the parasitic resistance between the drain of the current source and the n+ buried layer of the floating well as best seen in FIG. 7. A preferred layout of this embodiment is illustrated in FIG. 8. In this embodiment, to meet the minimum resistance that may be required for an application, it is necessary to create sufficient spacing between the floating well circuitry and the drain of the current sources. Such a spacing is represented by L1 in the FIG. 8 illustration. In this embodiment also, to prevent interference between the two current sources, they are optimally placed at opposite sides of the floating well circuit.

Thus, the structure illustrated in FIGS. 7 and 8 result in a parasitic resistor between the drain of the high-voltage LDMOS structure and the floating well circuit.

This parasitic resistor is highly dependent on the voltage between the floating well and the substrate, due to depletion at higher voltages. In instances where this voltage dependence is unacceptable, the parasitic resistance may be increased by creating a sufficient spacing between the drain of the HV-LDMOS structure and the floating well circuit resulting in a layout as illustrated in FIG. 8 and by using a more constant circuit element in parallel with the parasitic resistance. The use of such a more constant circuit element may be better understood with reference to FIG. 5. Additionally, creating and utilizing this parasitic resistance, although enabling the production of a device free of high-voltage interconnects and the limitations generated by the same as discussed above, also somewhat limits design layout flexibility and utilizes more chip area than is sometimes desired. Therefore, in especially preferred embodiments, the invention also comprises several steps for increasing the parasitic resistance and increasing the flexibility of the layout of the resulting structures.

Figure 9:
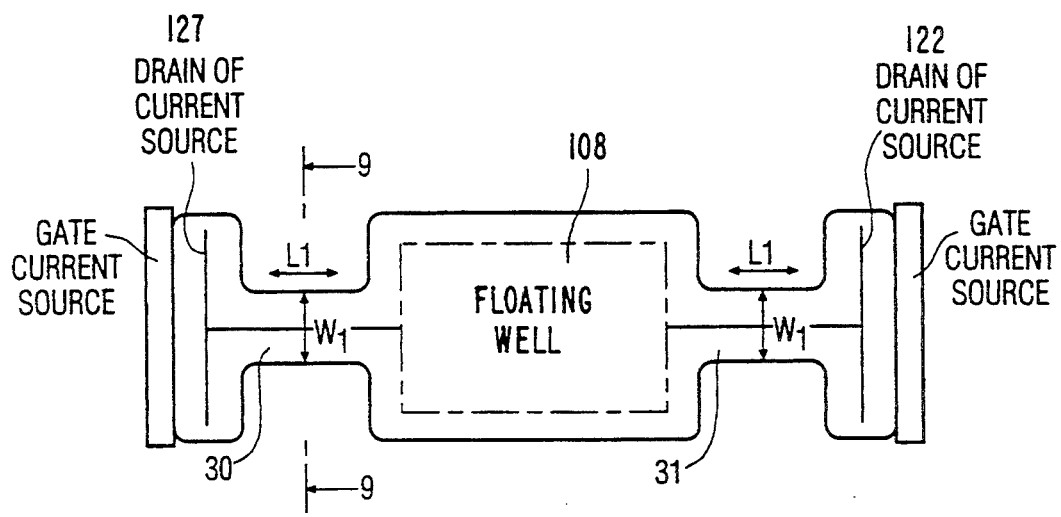
FIG. 9 is top view of a circuit layout of another embodiment of the invention.
Figure 10:
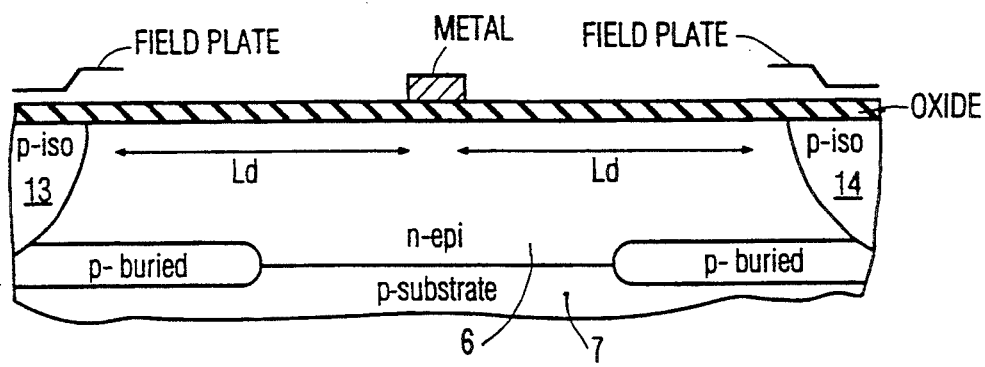
FIG. 10 is a cross-sectional view through the substrate of the circuit of FIG. 9 showing a portion of the integrated circuit taken along line 9—9.

In a preferred embodiment of the invention, one or both of the distances L1 and W1 between the current sources and the floating well are reduced and the cross-sectional areas 30, 31 of the interconnect regions are accordingly reduced. This is best illustrated in FIG. 9. Preferably, the interconnect regions are necked-in as illustrated in FIG. 9. This reduction in cross-sectional area by necking-in has been found to increase the parasitic resistance between the current sources and the floating well considerably. This necking-in also considerably reduces the interference between the two HV-LDMOS structures, allowing them to be placed everywhere along the periphery of the floating well instead of opposite each other. As will be seen from FIG. 10, in one embodiment the length of the drift region Ld is essentially the same as that for the floating well circuit. For example, it may be about 50$\mu$m for up to 600 v. In this embodiment of the invention, it is recognized that the oxide underneath the metal (see FIG. 10) can support at least partially the voltage between metal and the p-iso, p-buried, and p-substrate portions of the device. This means that the depletion in the n-epitaxial, p-substrate and p-buried portions only has to support the required breakdown voltage, minus the voltage that is supported by the oxide. This discovery makes it possible to reduce the drift region length Ld to that value that will support this lower voltage. For example, the Ld length may be reduced from 50 $\mu$m to 25 $\mu$m resulting in a smaller cross-section of the n-epitaxial region. This can be done as long as the critical field strength in the silicon at the edge of the metal as a result of curvature breakdown is not exceeded. In this embodiment, the area of the cross-section of the n-epitaxial region can be reduced even further, therefore also further increasing the parasitic resistance.

Figure 11:
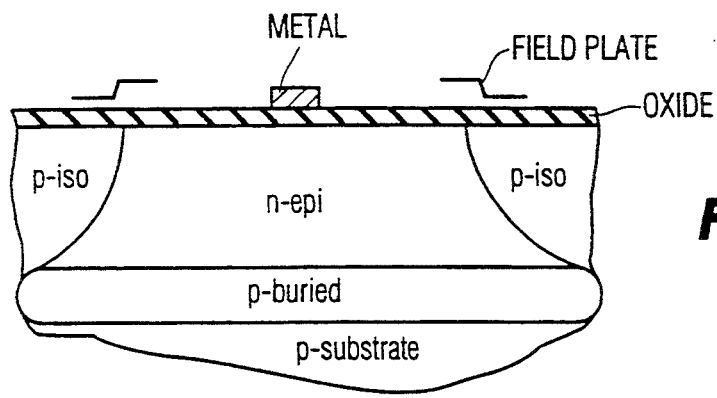
FIG. 11 is a sectional view of a modified version of the circuit of FIG. 9 showing a portion of the integrated circuit.

In yet another embodiment of the invention, it has been discovered that it is possible to extend the p-buried portion underneath the entire n-epitaxial portion as illustrated in FIG. 11 although this may not be possible for all breakdown voltages. In this embodiment, the cross-section of the n-epitaxial portion is minimized both from the sides and from the bottom up. This embodiment is particularly useful if the voltage between the metal and the n-epitaxial portion on the one hand and the P-diffusions on the other hand is temporarily relatively low.

It is possible in any or all of the embodiments illustrated in FIGS. 5 to 11 to provide HV-LDMOS circuits of minimum size circular configurations thereby minimizing their parasitic capacitance to the substrate.

It will be apparent that modification may be made in the details of the invention discussed herein above without departing from the scope of the invention. For example, it should be understood that although 1000 V is discussed above as an example of a high voltage supply rail, such is given by way of example only and is not meant to be restrictive since voltages ranging from 100 V to 1200 V or more may be utilized.

The invention has been described in terms of the use of resistors to convert the current drawn by the LDMOS devices, being used in a current source mode, into a voltage. It will be understood that the term "resistor" as used herein is used in the broadest possible sense, i.e. these resistors can essentially be almost any circuit element or combination of elements having the property that a current through or change in current through the combination of these elements results in a voltage across or change in voltage across the combination of these circuit elements. For example, these elements may be any essentially non-reactive circuit elements such as linear and non-linear resistors, transistors, diodes, etc.

We claim:

1. A device comprising:
   a substrate having an n-epitaxial layer on a surface thereof;
   at least one high-voltage LDMOS transistor configuration comprising current sources; and
   at least one parasitic resistor formed in the n-epitaxial layer between a drain of said LDMOS transistor and a floating well circuit; wherein:
   said current sources are located along a periphery of the floating well circuit;
   the floating well circuit is spaced by a predetermined distance (L1) from the drain of said LDMOS transistor, the spacing having a predetermined width (W1);
   the device exhibiting parasitic resistance effective to convert a level shift current signal to a voltage signal that is sensed by the floating well circuit.

2. A device as claimed in claim 1 wherein the parasitic resistance is increased by increasing the spacing between said drain and said floating well circuit.

3. A device as claimed in claim 2 wherein a cross-sectional area of the n-epitaxial layer is reduced by reducing said width (W1) thereof to separate drain terminals of said LDMOs transistor and the floating well circuit.

4. A device as claimed in claim 3 having a breakdown voltage and wherein said cross-sectional area is reduced by decreasing a length of a drift region (Ld) relative to a p-buried diffusion region on said substrate, the maximum amount of said decreased length of said drift region Ld being determined by the breakdown voltage.

5. A device as claimed in claim 3 wherein the cross-sectional area is reduced by reducing a cross-section of the n-epitaxial layer and extending a p-buried portion underneath substantially all of said n-epitaxial layer.

6. A device as claimed in claim 1 wherein the LDMOS transistors are circular.

7. A device as claimed in claim 1 wherein said current sources are located adjacent each other.

8. A device as claimed in claim 1 wherein said current sources are placed at opposite sides of the floating well circuit.

9. A device as claimed in claim 1 having a parasitic resistor between a drain of the LDMOS transistor and an n+ buried layer of the floating well circuit.

10. A device as claimed in claim 1, further comprising a fixed resistor coupled in parallel with said parasitic resistor.

11. A device as in claim 10, wherein said fixed resistor is located adjacent a surface of said device.

12. A semiconductor integrated circuit chip having a p-type substrate with a floating well circuit having an N-well portion and a p-well portion therein;
    at least one LDMOs transistor configuration comprising level shift current sources and connected in said integrated circuit to said floating well circuit for controlling a current thereof; and
    at least one parasitic resistor connected in said integrated circuit between a drain of the at least one LDMOS transistor and the N-well portion of the floating well circuit,
    wherein:
    the floating well circuit is spaced by a predetermined distance (L1) from the drain of the at least one LDMOS transistor, said spacing having a predetermined width (W1); and
    the device exhibiting a parasitic resistance and a flow of current to a low voltage region of the device, said current being utilized to generate a voltage signal that is sensed by the floating well circuit.

13. An integrated circuit chip as claimed in claim 12 wherein the floating well circuit is a portion of a semiconductor body comprising:
    said p-type substrate;
    an n-epitaxial drift layer portion formed on said p-type substrate; and
    an n+ buried region arranged adjacent to said n-epitaxial layer and below said floating well.

14. An integrated circuit chip as claimed in claim 13 wherein the parasitic resistance is increased by reducing a cross-sectional area of said n-epitaxial portion of the substrate by reducing a width (W1) thereof separating drain terminals of said LDMOS transistor and the floating well circuit.

15. A semiconductor integrated circuit chip as claimed in claim 14 wherein said chip is capable of supporting a high voltage between the floating well circuit and the substrate in the absence of high voltage interconnects.

16. An integrated circuit chip as claimed in claim 13 having a breakdown voltage and wherein the parasitic resistance is increased by decreasing a length of said drift region (Ld) relative to a p-buried diffusion region present on said substrate, the maximum amount of said decreased length of said drift region (Ld) being determined by the breakdown voltage.

17. A semiconductor integrated circuit chip as claimed in claim 16 wherein said chip is capable of supporting a high voltage between the floating well circuit and the substrate in the absence of high voltage interconnects.

18. An integrated circuit chip as claimed in claim 13 wherein a cross-sectional area is reduced by reducing a cross-section of said n-epitaxial portion and extending a p-buried portion underneath substantially the entire n-epitaxial portion.

19. A semiconductor integrated circuit chip as claimed in claim 13 wherein said chip is capable of supporting a high voltage between the floating well circuit and the substrate in the absence of high voltage interconnects.

20. A semiconductor integrated circuit chip as claimed in claim 12 wherein said chip is capable of supporting a high voltage between the floating well circuit and the substrate in the absence of high voltage interconnects.

21. A device as claimed in claim 12, further comprising a fixed resistor coupled in parallel with said parasitic resistor.

22. A device as in claim 21, wherein said fixed resistor is located adjacent a surface of said device.

23. An integrated circuit comprising:
a p-type substrate;
an n-epitaxial drift layer formed on the substrate,
multiple p+ isolation regions formed in said n-epitaxial drift layer to create at least two separate n-epitaxial regions;
a portion in a first n-epitaxial region having at least one P-well region and at least one N-well region of a floating well circuit;
an n+ buried region beneath said p-well and n-well regions;
level shift regions comprising at least one LDMOS transistor and body, source and drain regions thereof formed within said first n-epitaxial region and comprising current sources located along a periphery of the floating well circuit;
a plurality of polysilicon gates; and
at least one N-MOS device, formed inside said P-well region, and at least one PMOS device formed inside the N-well region, forming part of the circuitry inside the floating well, said drain regions being spaced from said n+ buried region by a distance (L1), a parasitic resistance being created between said drain regions and said n+ buried region which is functionally utilized without high-voltage interconnections.

24. An integrated circuit as claimed in claim 23 wherein the at least one LDMOS transistor is circular.

25. An integrated circuit as claimed in claim 23 wherein said current sources are located adjacent each other.

26. An integrated circuit as claimed in claim 23 wherein said current sources are placed at opposite sides of the floating well circuit.

27. A semiconductor integrated circuit chip comprising an integrated circuit as claimed in claim 23 wherein said chip is capable of supporting a high voltage between the floating well circuit and the substrate without high voltage interconnects.

28. A device as claimed in claim 23, further comprising a fixed resistance coupled in parallel with said parasitic resistor.

29. A device as in claim 28, wherein said fixed resistor is located adjacent a surface of said device.

* * * * *